United States Patent
Tsorng et al.

(10) Patent No.: US 11,425,844 B2
(45) Date of Patent: Aug. 23, 2022

(54) RISER MODULE WITH AN INTEGRATED COOLING DUCT

(71) Applicant: Quanta Computer Inc., Taoyuan (TW)

(72) Inventors: Yaw-Tzorng Tsorng, Taoyuan (TW); Jen-Jia Liou, Taoyuan (TW); Hsi-Chi Chien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/074,089

(22) Filed: Oct. 19, 2020

(65) Prior Publication Data

US 2021/0410335 A1    Dec. 30, 2021

Related U.S. Application Data

(60) Provisional application No. 63/046,252, filed on Jun. 30, 2020.

(51) Int. Cl.
*H05K 7/20* (2006.01)
*G06F 1/20* (2006.01)

(52) U.S. Cl.
CPC ........... *H05K 7/20727* (2013.01); *G06F 1/20* (2013.01); *H05K 7/20145* (2013.01)

(58) Field of Classification Search
CPC .. H05K 7/20727; H05K 7/20145; G06F 1/20; G06F 1/16
See application file for complete search history.

(56) References Cited

U.S. PATENT DOCUMENTS

| | | | | |
|---|---|---|---|---|
| 6,822,863 | B1 * | 11/2004 | Artman | H05K 7/20172 165/104.33 |
| 6,970,353 | B2 * | 11/2005 | Brovald | G06F 1/20 165/121 |
| 2013/0070409 | A1 * | 3/2013 | Hoss | G06F 1/20 361/679.31 |
| 2014/0146471 | A1 * | 5/2014 | Liu | H05K 7/20727 361/695 |
| 2017/0013742 | A1 * | 1/2017 | Oota | H05K 7/20145 |
| 2017/0160775 | A1 * | 6/2017 | Sun | F24F 11/79 |
| 2020/0396861 | A1 * | 12/2020 | Baldwin, Jr. | H05K 5/026 |
| 2021/0116978 | A1 * | 4/2021 | Yu | G06F 1/186 |

* cited by examiner

*Primary Examiner* — Stephen S Sul
(74) *Attorney, Agent, or Firm* — Nixon Peabody LLP

(57) ABSTRACT

Described herein are example riser modules for holding electrical components such as PCIe cards. The riser modules include a riser bracket and an opening to an interior space of the riser bracket. The riser modules also include an air duct movably coupled to the riser bracket. The air duct is movable between a plurality of positions relative to the riser bracket. The plurality of positions including at least an open position and a closed position.

12 Claims, 12 Drawing Sheets

RISER MODULE WITH AN INTEGRATED COOLING DUCT

PRIORITY CLAIM

This application claims priority under 35 U.S.C. § 119 to U.S. Provisional Application No. 63/046,252, entitled "DESIGN OF PCIE RISER MODULE INTEGRATED THERMAL COOLING SOLUTIONS", and filed on Jun. 30, 2020. The contents of that application are hereby incorporated by reference in their entirety.

TECHNICAL FIELD

The present disclosure relates generally to a PCIe riser module with an integrated cooling duct. More particularly, aspects of this disclosure relate to a riser bracket and an air duct that is movably coupled to the riser bracket.

BACKGROUND

Servers are specialized computer systems that include numerous electrical components integrated into a single unit using a server chassis. Common to all servers is some form of a mother board including a CPU, slots for memory (e.g., DDR3, DDR4, DRAM), PCIe (Peripheral Computer Interconnect Express) slots, and connectors to other components, such as hard drives, a power supply, and peripherals (e.g., USB ports, LAN and other I/O ports). In addition to these components, the chassis also is designed to include fans, air ducts, heat sinks and the like to maintain optimal temperatures.

PCIe is an industry-standard interface I/O and connectivity solution. PCIe is used to communicate with CPUs and the outside world of I/O networking electric components. In addition to providing attachment of traditional LAN, SAN, MAN, and WAN electric components, PCIe is also used for attaching electric components such as GPUs and video cards to servers. In some implementations, a PCIe riser bracket is used to mount and secure one or more of the PCIe electrical components to the server.

FIG. 1A illustrates a prior art server 100 having a PCIe thermal solution 102 as part of the chassis 104. The thermal solution 102 is an air duct having vents facing towards the front of the server 100. A PCIe riser module 106, including a PCIe bracket 108 and PCIe electric components 110 (e.g., GPU card), is shown. The riser module 106 can be loaded into a riser module dock 112, as indicated by a large arrow 114. Fans 116 are mounted at the front of the chassis 104. The fans 116 provide air flow into the server 100, as indicated by a large arrow 118.

FIG. 1B illustrates the prior art server 100 with the riser module 106 in riser module dock 112 of the chassis 104. Air flow 118 continues through a duct 120 of the chassis 104, to the riser module 106. The air flow is further directed to the electric components 110 by the thermal solution 102.

One problem associated with current designs is that they require the thermal solution 102 to be an integrated chassis component. The placement of the thermal solution 102 cannot be easily matched to a PCIe riser bracket for optimal cooling. Placement of the PCIe riser bracket also presents a problem because tedious alignment must be performed.

Thus, there is a need for a PCIe riser bracket cooling solution that is simple to implement and does not require additional components. For example, it would be desirable for the PCIe riser cooling solution to be easy to interchange in a server chassis, without requiring additional chassis components. According to another non-limiting example, it would be further desirable for a PCIe riser cooling solution to provide improvements in cost and efficiency for server designs.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

A first implementation of the disclosure is a riser module. The riser module includes a riser bracket and an air duct movably coupled to the riser bracket. The riser bracket has a side opening to an interior space. The interior space is configured to receive one or more electrical components. The air duct has at least one air vent for cooling the interior space of the riser bracket. The air duct is movable between a plurality of positions relative to the riser bracket. The plurality of positions includes at least an open position and a closed position.

Optionally, in the closed position, the air vent provides an air flow path leading into the interior of the riser bracket. Conversely, in the open position, the side opening provides an electrical component loading path leading into the interior of the riser bracket. Optionally, the air duct is removably detached from the riser bracket in the open position. Also optionally, the air duct is rotatably movable between the open position and the closed position. In this option, the air duct is rotated away from the riser bracket in the open position.

In some implementations, the riser bracket includes a front wall and a top wall. The front wall and the top wall define, in part, the interior space of the riser bracket. The front wall is proximate to the side opening. The air vent provides air flow into the interior proximate to the front wall. Optionally, the air duct is hingedly connected to the riser bracket near the front wall. Optionally, in the closed position, the air duct is in contact with the riser bracket along a top edge.

Optionally, the riser module further includes a coupling recess and a coupling protrusion. The coupling recess matingly engages the coupling protrusion in the closed position. Optionally, the coupling recess is part of one of the riser bracket or the air duct. In this option, the coupling protrusion is part of the other one of the riser bracket or the air duct.

Optionally, the riser module further includes one or more electrical component docking stations mounted to a wall in the interior space of the riser bracket. Optionally, the electrical component docking station is mounted to a wall opposite the side opening of the riser bracket. In some implementations, the riser bracket includes one or more slots in a wall of the riser bracket. The slots are for slide-in placement of one or more electrical components into the interior space of the riser bracket.

A second implementation of the disclosure is a server system. The server system includes a chassis, a fan and a riser module. The chassis includes a riser dock, where the riser module is positionable in the riser dock. The fan is mounted to the chassis. The riser module is as described in the first implementation. Optionally, the server system further includes a loaded configuration, and an unloaded configuration. In the loaded configuration, the riser module is positioned in the riser dock, and the air duct is in the closed position. In the unloaded configuration, the riser module is removed from the riser dock. The unloaded configuration also provides an unobstructed access to the side opening of the riser bracket, when the movable air duct is in the open position. Optionally, in the loaded configuration, the fan is configured to provide ambient air from outside the chassis, to the air vent, and into the interior of the riser bracket.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
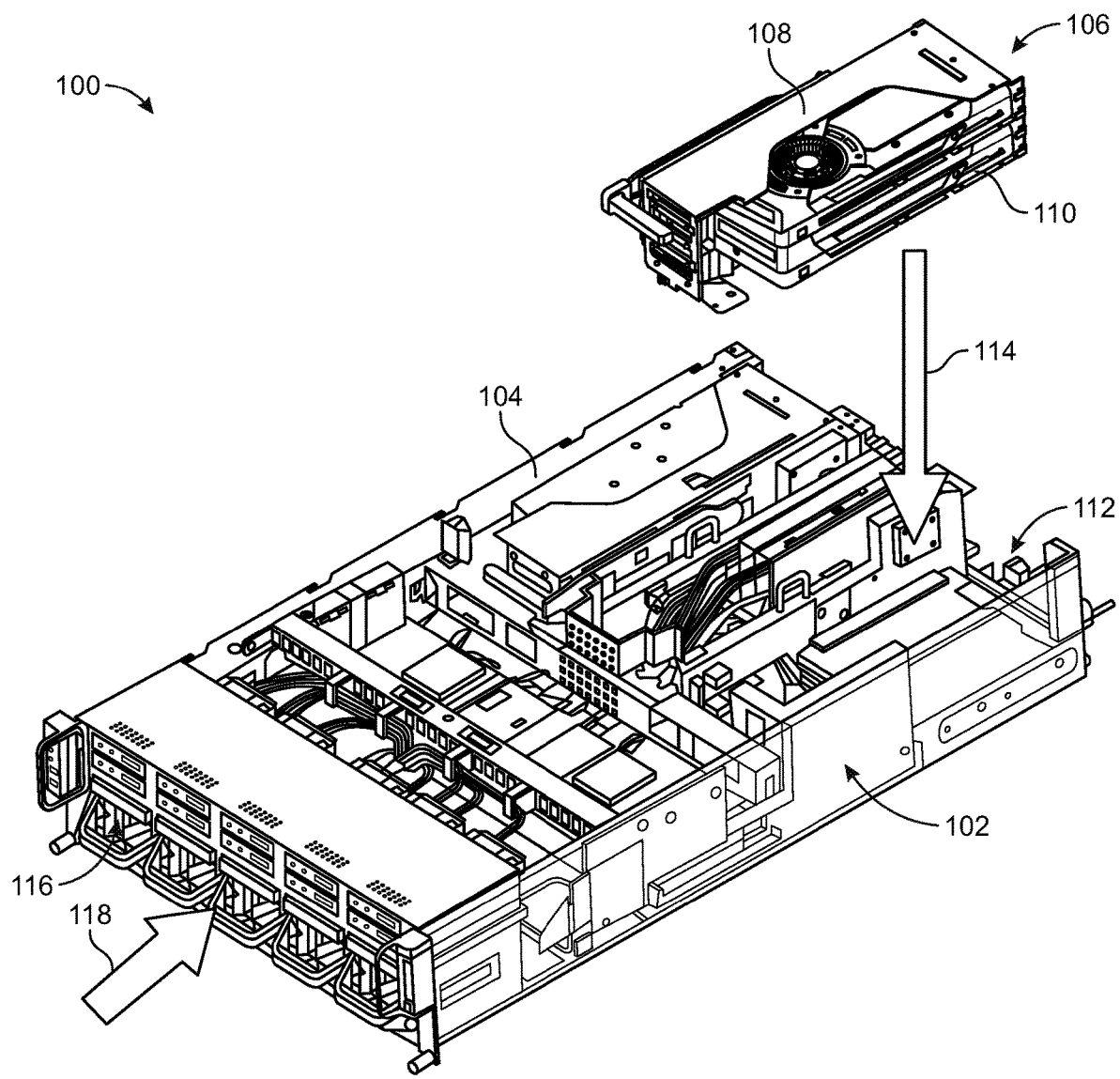
FIG. 1A is a perspective view of an example prior art server chassis with a PCIe cooling system.
Figure 1B:
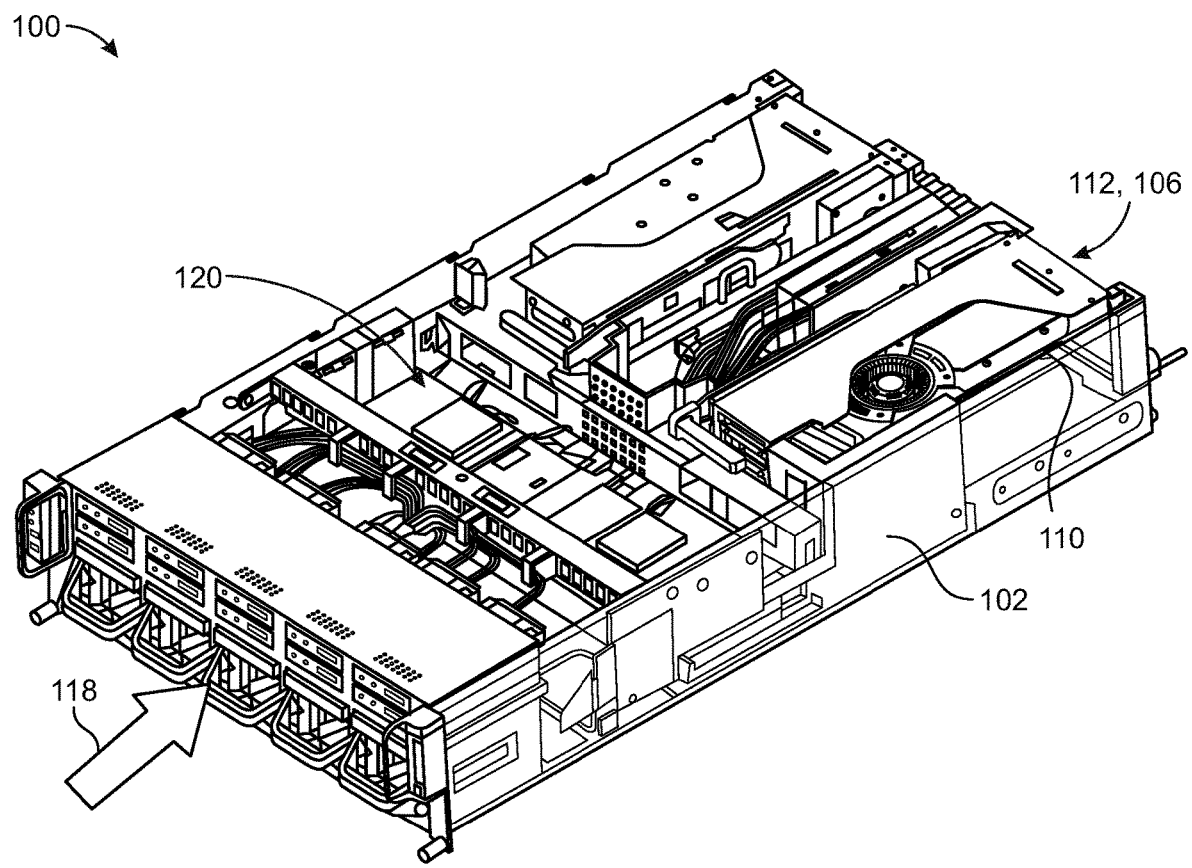
FIG. 1B is a perspective view of the prior art server chassis of FIG. 1A with a riser module installed.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed to a riser module having a riser bracket, e.g., a PCIe riser bracket, and an air duct that is movable relative to the riser bracket. The air duct can be moved to allow access to an interior space of the riser bracket. This allows for placement of electric components, e.g., PCIe electrical components, into the interior space. In some implementations, the air duct is removed from the riser bracket to provide access to the interior space of the riser bracket. In some other implementations, the air duct can be rotated into a position that allows access into the interior space of the riser bracket. In some implementations, the air duct is an integrated part of the riser bracket and not part of a server chassis.

Figure 2:
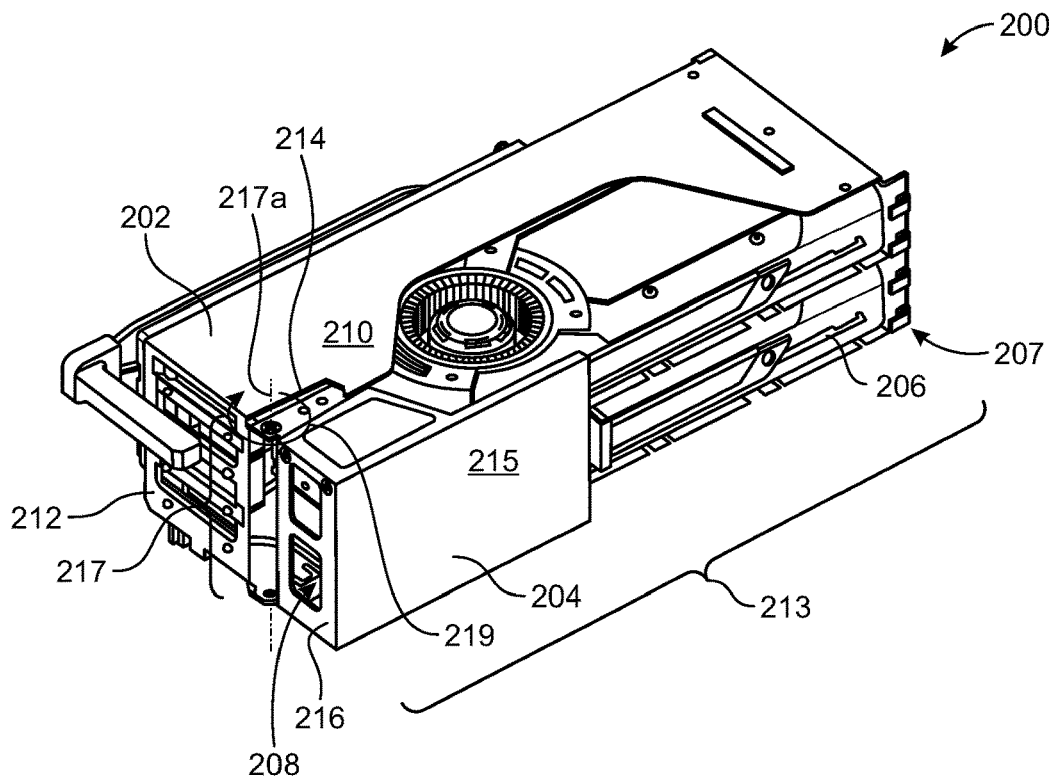
FIG. 2 is a perspective view of a riser module according to some implementations.

FIG. 2 is a perspective view of a riser module 200 according to some implementations. The riser module has a riser bracket 202 and an air duct 204. Two electrical components (e.g., GPU cards) 206 are shown installed in an interior space 207 of the riser module 200. The air duct 204 includes at least one vent 208.

Any electrical component having a form factor that matches the riser modules described herein can be used. Without limitation, this includes GPU cards, graphic cards, ruler devices, network interface cards (NIC), storage cards, and PCIe cards.

In the figures shown herein, walls or plates are shown defining the riser modules, such as the riser module 200. For clarity, the term "wall" is used to describe elements of riser brackets, and the term "plate" is used to describe elements of air ducts. Both these terms denote flat thin features. Features such as holes, cut-outs, indentations, protrusions, and edges are also included as features of the walls. The walls can also be bent or otherwise shaped. One or more wall can be jointed or connected to another one or more wall. Connections can be by any means such as fasteners or a weld. In some implementations, a single wall is bent and forms the equivalent of two walls. For example, a wall can be bent at an angle of 90 degrees and forms two walls perpendicular to each other.

The riser bracket 202 includes a top wall 210 and a front wall 212. The top wall 210 and front wall 212 define, in part, a side opening 213 to the interior space 207 of the riser bracket. The side opening 213 is for placement of the electrical components 206 into the riser bracket 202. A top edge 214 of top wall 210 is in contact with the air duct 204, when the air duct 204 is in the closed position relative to the riser bracket 202. In the closed position, the side opening is at least partially covered by the side plate 215. The air duct 204 includes a front plate 216. Cut outs in the front plate 216 form the air vents 208. The air vents provide air flow into the interior space 207.

In some implementations, the riser modules include a hinge connecting the riser bracket to the air duct. Different hinges can be used, but the general function and operation allows two members to rotate about a principle axis of the hinge while remaining "hingedly" connected along the principle axis. For example, hinges can include interleaving knuckles on a corresponding first wall and second wall with a pin threaded through. The pin is commensurate with the principle axis of the hinge. Other possibilities include a protrusion in a first member mating with an indentation in the second member that allows for rotation along the principle axis of the hinge. Yet another non-limiting example is a flexible material connecting a first plate along a first edge and a second plate along a second edge. The flexible material allows for movement of the first plate relative to the second plate wherein the principle axis of the hinge is proximate to the flexible material, the first edge, and the second edge.

Returning to FIG. 2, the riser bracket 202 and air duct 204 are connected by a hinge 217 having a principle axis 217a. The principle axis 217a is proximate to the front wall 212 and front plate 216. Rotation of the air duct 204 relative to the riser bracket 202 is constrained to an arc indicated by curved arrow 219. The arc indicated by arrow 219 has a center of rotation of the principle axis 217a. The foregoing explains in detail the operation of the hinge.

FIGS. 3A-3E show perspective views illustrating the steps for loading electrical components 206 into the riser module 200.

Figure 3A:
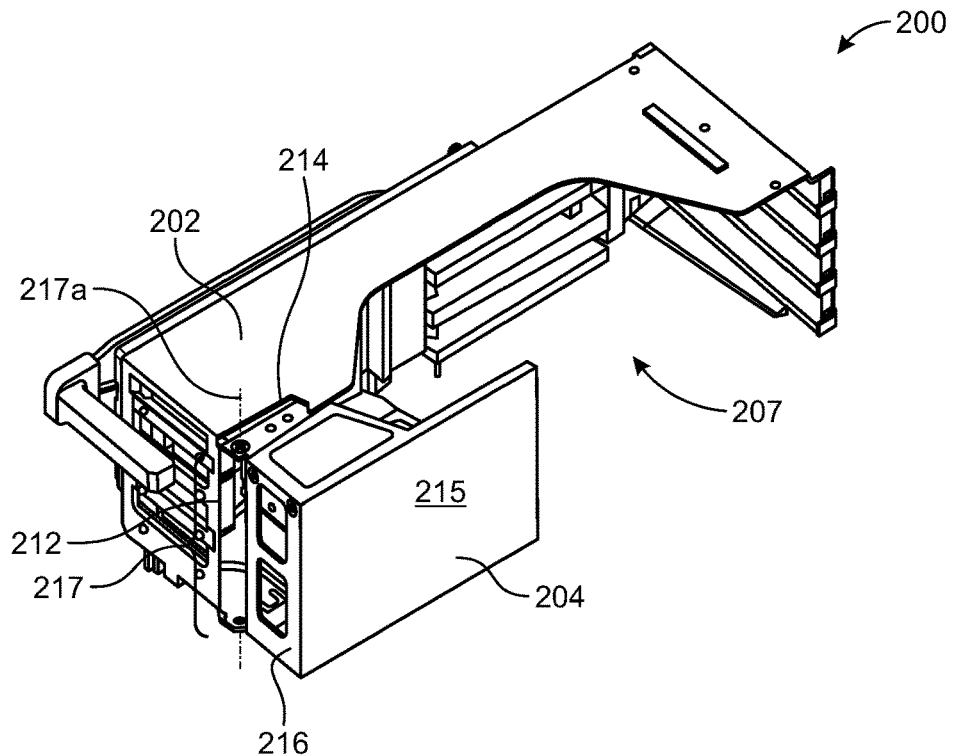
FIG. 3A-3E show perspective views illustrating steps for loading of electric components into the riser module of FIG. 2.

FIG. 3A shows the riser module 200 wherein the air duct 204 is in a closed position relative to the riser bracket 202. the hinge 217 facilitates rotation of the air duct 204 relative to the riser bracket 202. The hinge 217 is mounted proximate to the front wall 212 and front plate 216, and has the rotation axis 217a. In the closed position, the top edge 214 of the riser bracket 202 contacts the air duct 204. A side plate 215 blocks access to the interior space 207.

Figure 3B:
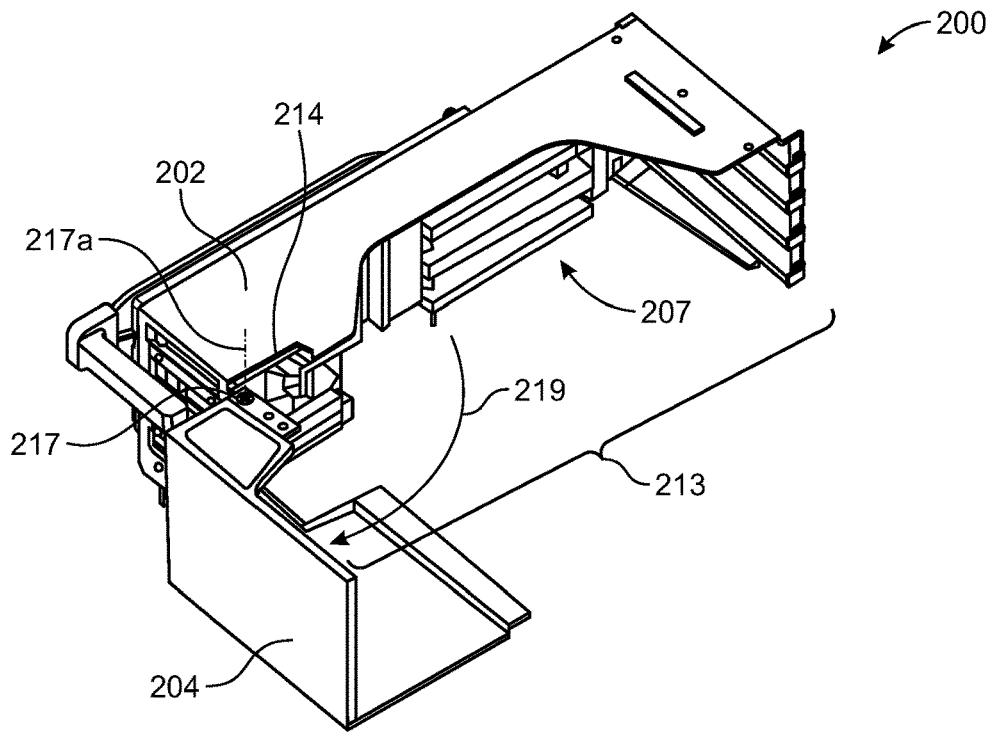

FIG. 3B illustrate the operation of the hinge 217 of riser module 200. Specifically, the hinge 217 facilitates the rotation of the air duct 204 through the arc indicted by curved arrow 219, with the trajectory having a center of rotation about the principle axes 217a of the hinge. The air duct 204 is rotated away from top edge 214 to the open position. The open position allows access to the interior space 207 through the side opening 213.

Figure 3C:
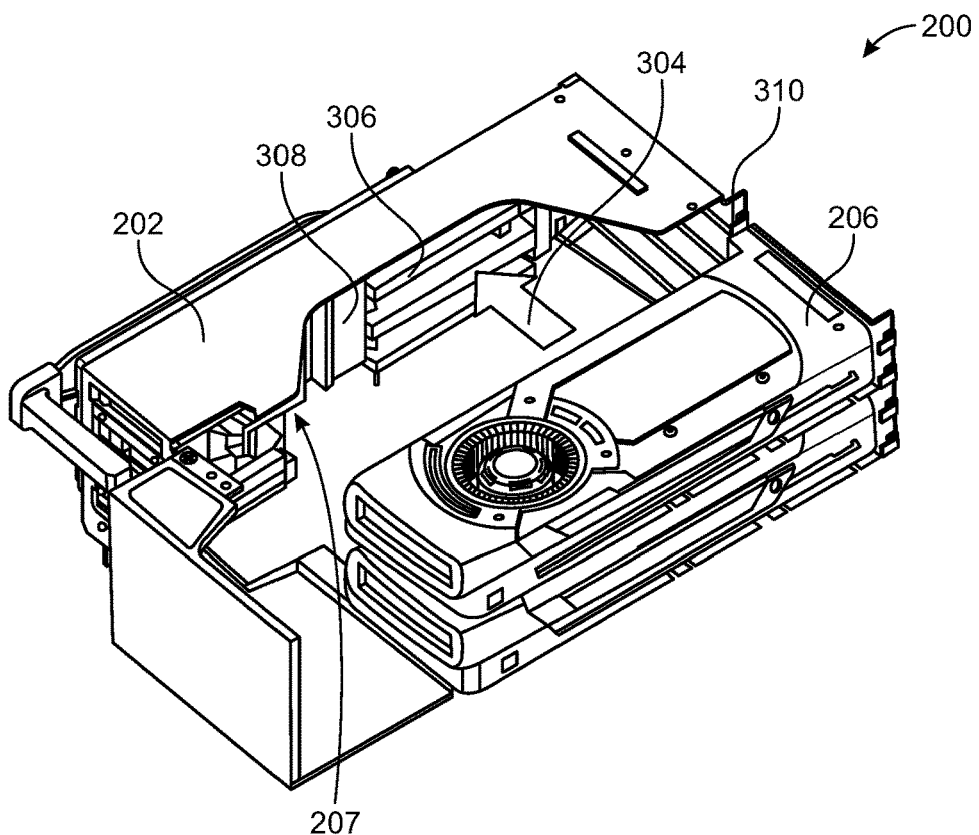

FIG. 3C shows placement of the electric components 206 into riser module 200. The placement of the electrical components 206 into the interior space 207 of the riser bracket 202 is illustrated via large arrow 304. Electrical component docking stations 306, that are mounted to a side wall 308 of the riser bracket 202, are also shown. The docking stations 306 provide electrical and mechanical contact with the electrical components 206. According to another feature, slots 310 are included in a back wall (PCB) of the riser bracket 202. The slots 310 provide alignment and slide-in placement of the electrical components 206 into the riser bracket 202.

Figure 3D:
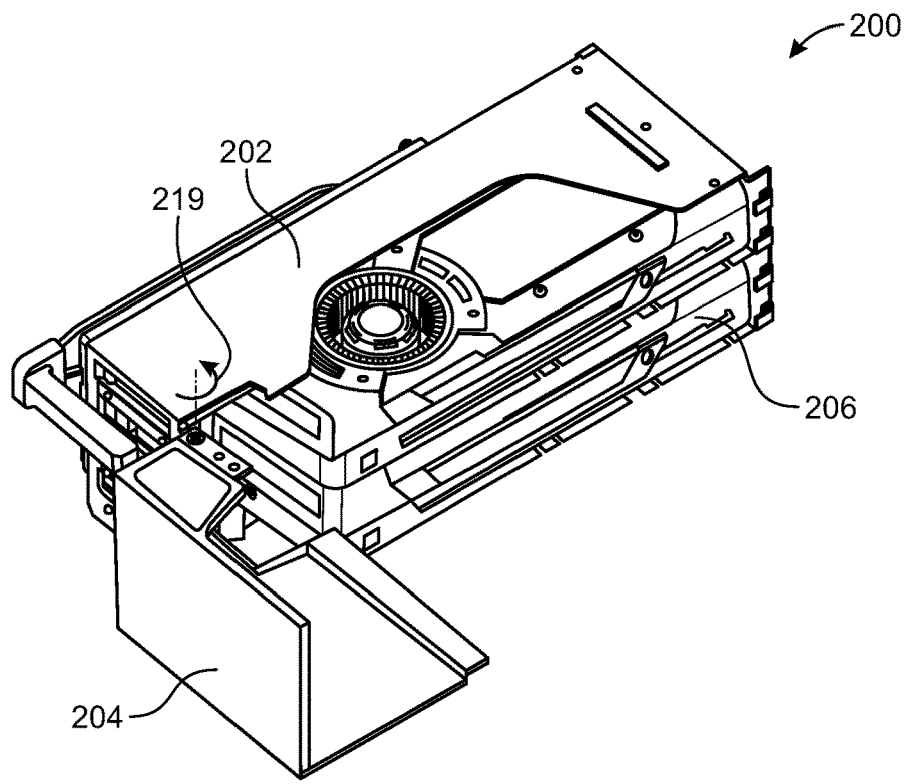

FIG. 3D shows the riser module 200 with the electrical components 206 loaded in position in the riser bracket 202. With the electrical components 206 in position, the air duct 204 is rotated (in the direction of the curved arrow 219) to close it relative to the riser bracket 202.

Figure 3E:
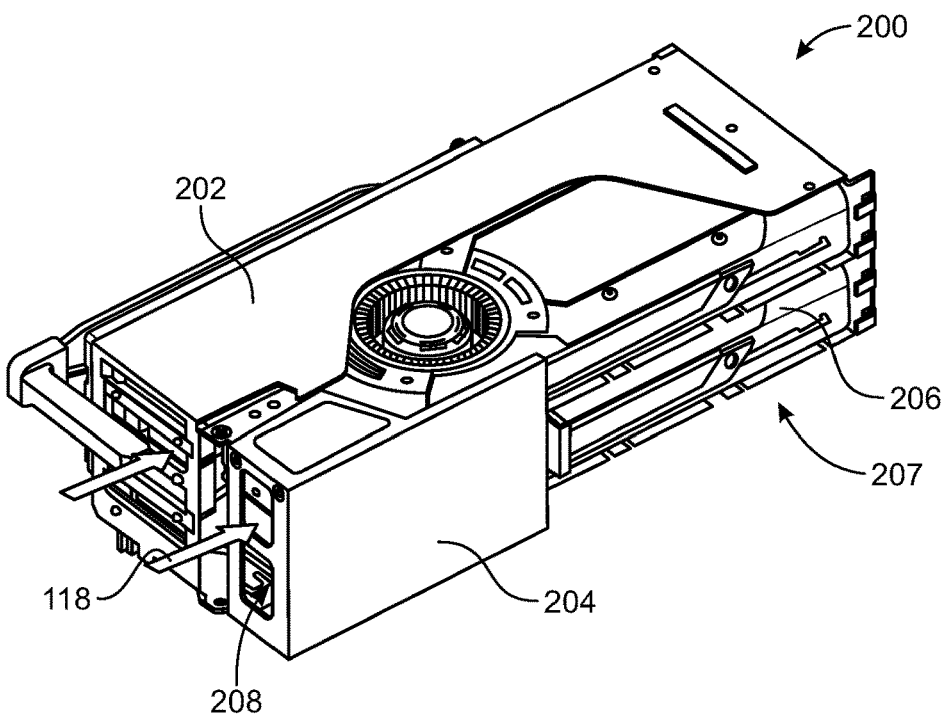

FIG. 3E completes the steps depicted by previous FIGS. 3A-3D. The riser module 200 is shown with the electric components 206 loaded into the riser bracket 202, and the air duct 204 is in the closed position. The air vents 208 provide air flow 118 into the interior space 207 to cool electrical components 206.

Figure 4:
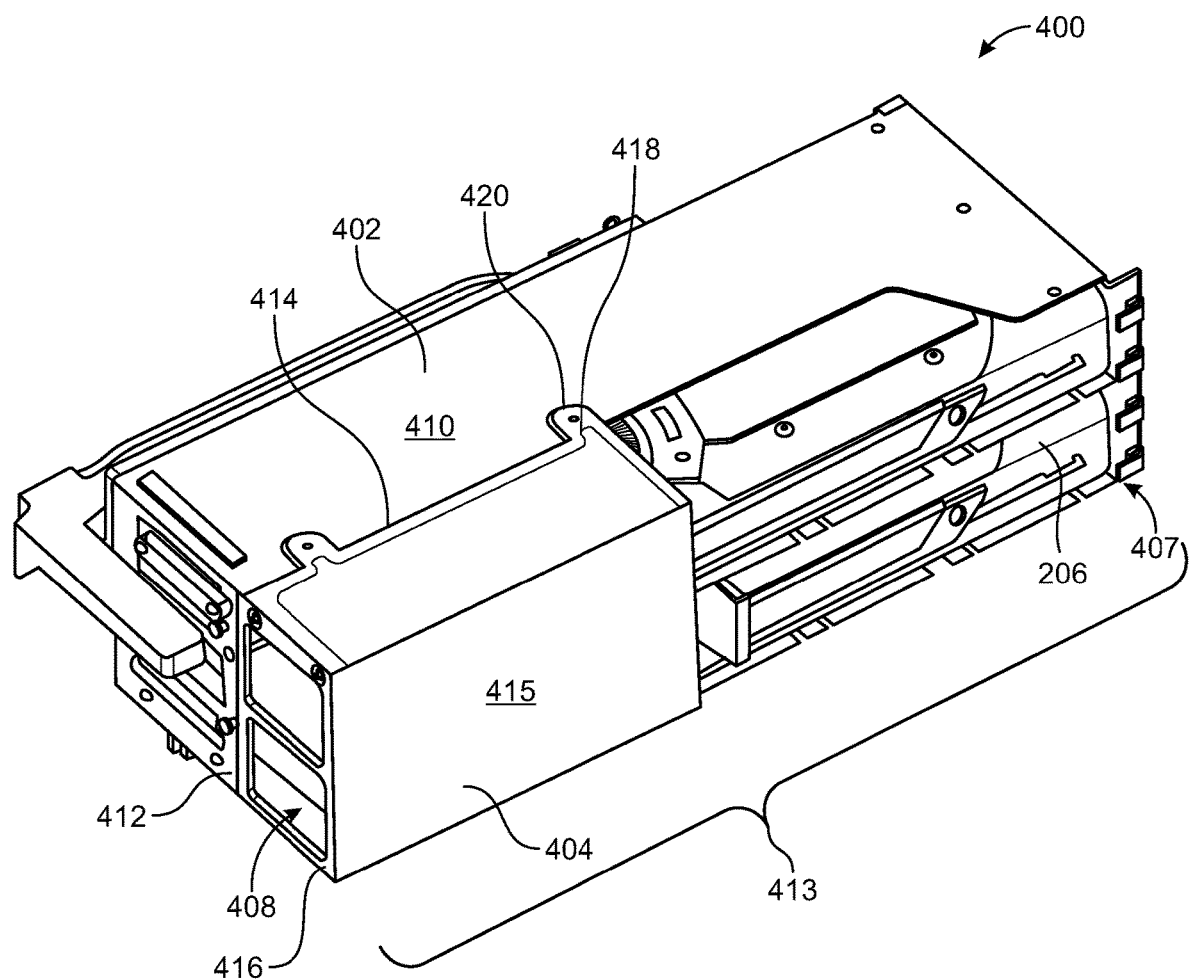
FIG. 4 is a perspective view of a riser module according to some other implementations.

FIG. 4 is a perspective view of a riser module 400 according to some implementations. The riser module 400 has a riser bracket 402 and an air duct 404. Two electrical components 206 are shown in the riser module 400. The air duct 404 includes air vents 408.

The riser bracket 402 includes a top wall 410 and a front wall 412. The top wall 410 and front wall 412 define, in part, a side opening 413 to the interior space 407 of the riser bracket. The side opening 413 is for placement of the electrical components 206 into the riser bracket 402. A top edge 414 of top wall 410 is in contact with the air duct 404, when the air duct 204 is in the closed position relative to the riser bracket 402. In the closed position, the side opening 413 is at least partially covered by the side plate 415. The air duct 404 includes a front plate 416. Cut outs in the front plate 416 form the air vents 408. The air vents provide air flow into the interior space 407.

In some implementations, the example riser modules include coupling features. The coupling features provide alignment of the riser brackets with their corresponding the air ducts. The coupling feature can also provide fastening or fixing of an air duct to a riser bracket. In some implementations, the coupling feature includes a first element and a second matching element. The coupling features can include one or more protrusions for mating to a matching recess. For example, a first coupling feature can be a protrusion on a wall, and a second coupling feature can be a matching recess on a plate. Alternatively, a first coupling feature can be a recess on a wall, and a second coupling feature can be a matching protrusion on a plate. Multiple coupling features can be used to align a riser bracket to an air duct. Some implementations include one or more of a tongue and groove, snap in placement, a hole and pin, a slot and pin, protrusion with matching recess, a male to female fitting, a matching interference fit, a rail with matching groove, or the like.

Returning to FIG. 4, the riser bracket 402 and air duct 404 include a coupling feature. The coupling feature includes a protrusion 418 in air duct 404, and a recess 420 in bracket 402. The protrusion 418 mates with the recess 420 in the closed position of the riser module 402.

FIGS. 5A-5E show perspective views illustrating the steps for loading electrical components 206 into the riser module 400.

Figure 5A:
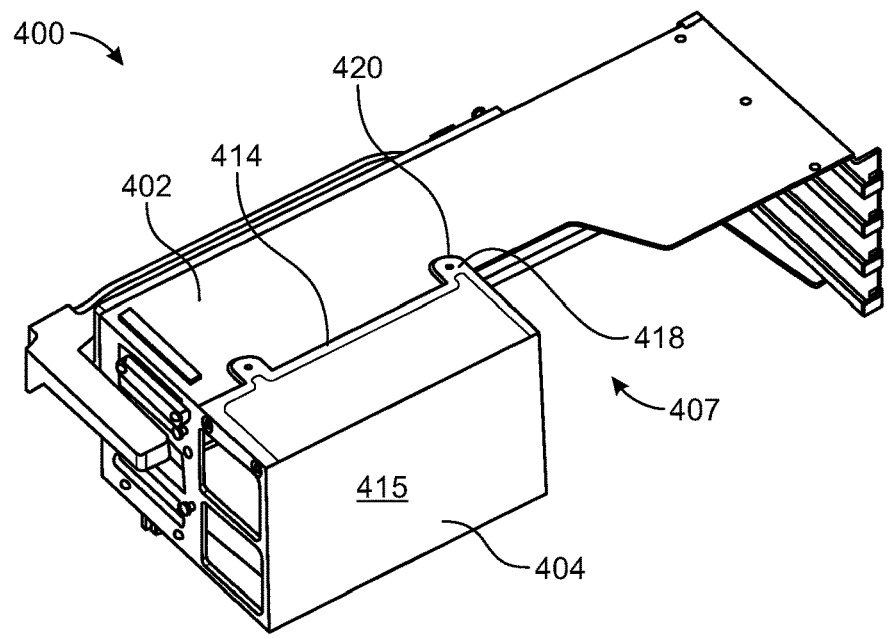
FIG. 5A-5E show perspective views illustrating steps for loading of electric components into the riser module of FIG. 4.

FIG. 5A shows the riser module 400 wherein the air duct 404 is in a closed position relative to the riser bracket 402. The coupling feature includes the protrusion 418 and the recess 420 as shown. The coupling feature 418, 420 provides alignment of the air duct 404 with the riser bracket 402. The coupling feature 418, 420 also allows for removing the air duct 404 from the riser bracket 402. In the closed position, the top edge 414 contacts the air duct 404. Side plate 415 blocks access to the interior space 407.

Figure 5B:
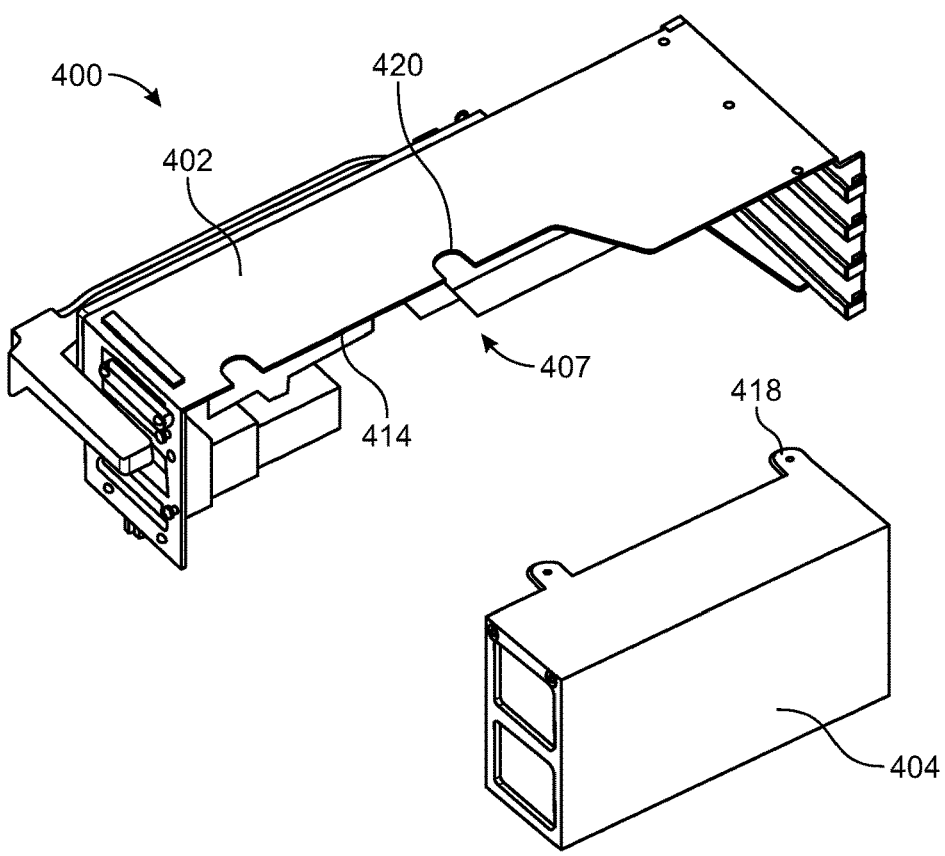

FIG. 5B illustrate the operation of the coupling feature 418, 420 of riser module 400. Specifically, the indentation 418 is disengaged from protrusion 418 as the air duct 404 is moved away from top edge 414. This provides access to the interior space 407 of the bracket 402.

Figure 5C:
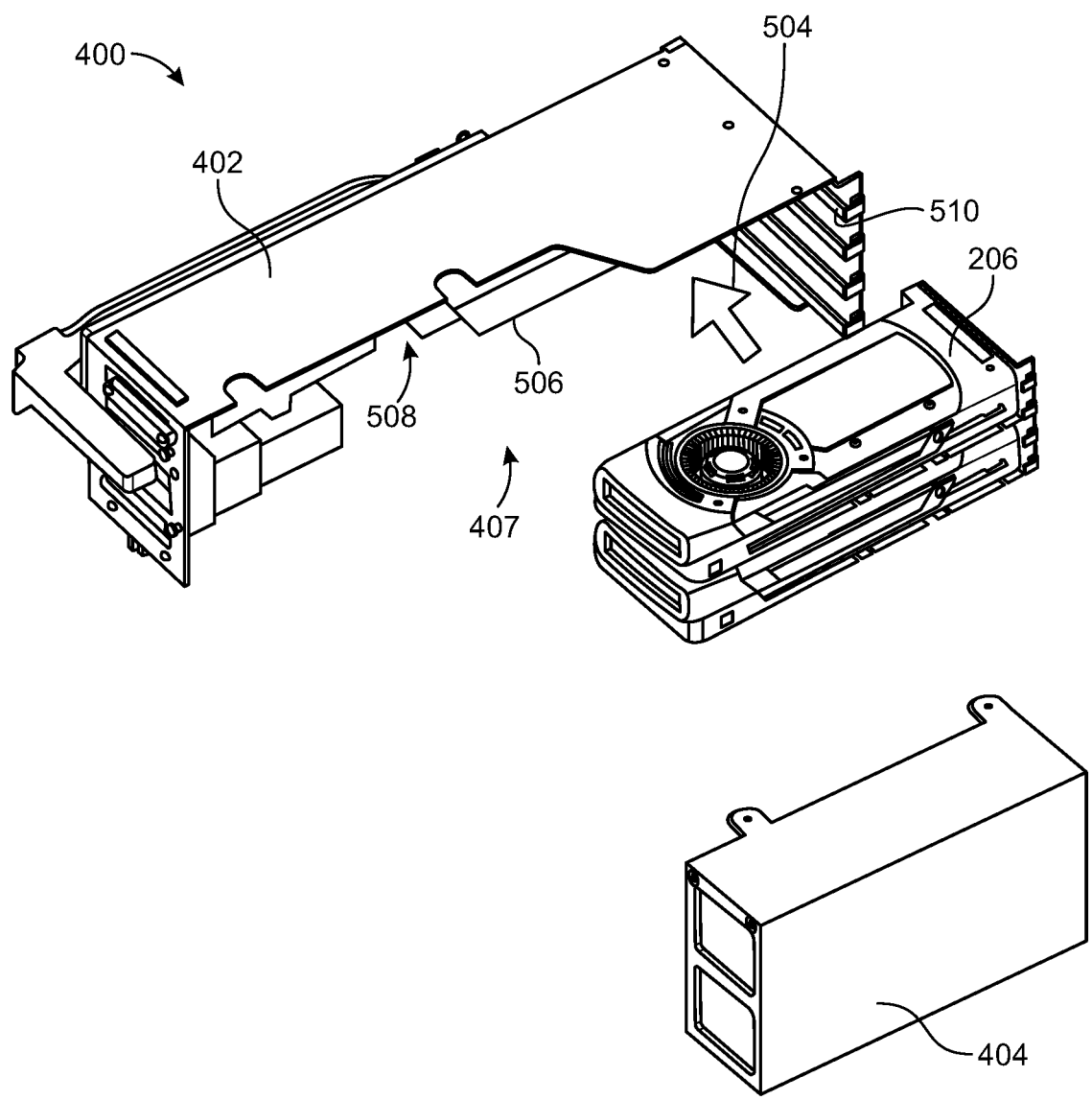

FIG. 5C illustrates placement of electric components 206 into riser module 400. The placement of electrical components 206 into the interior space 407 is illustrated via a large arrow 504. Electrical component docking stations 506, which are mounted to a side wall 508 of the riser bracket 402, are also shown. The docking stations 406 provide electrical and mechanical contact with the electrical components 206. Another feature illustrated is slots 510 in a back wall (PCB) of the riser bracket 502. The slots 510 provide alignment and slide in placement of the electrical components 206 into the riser bracket 502.

Figure 5D:
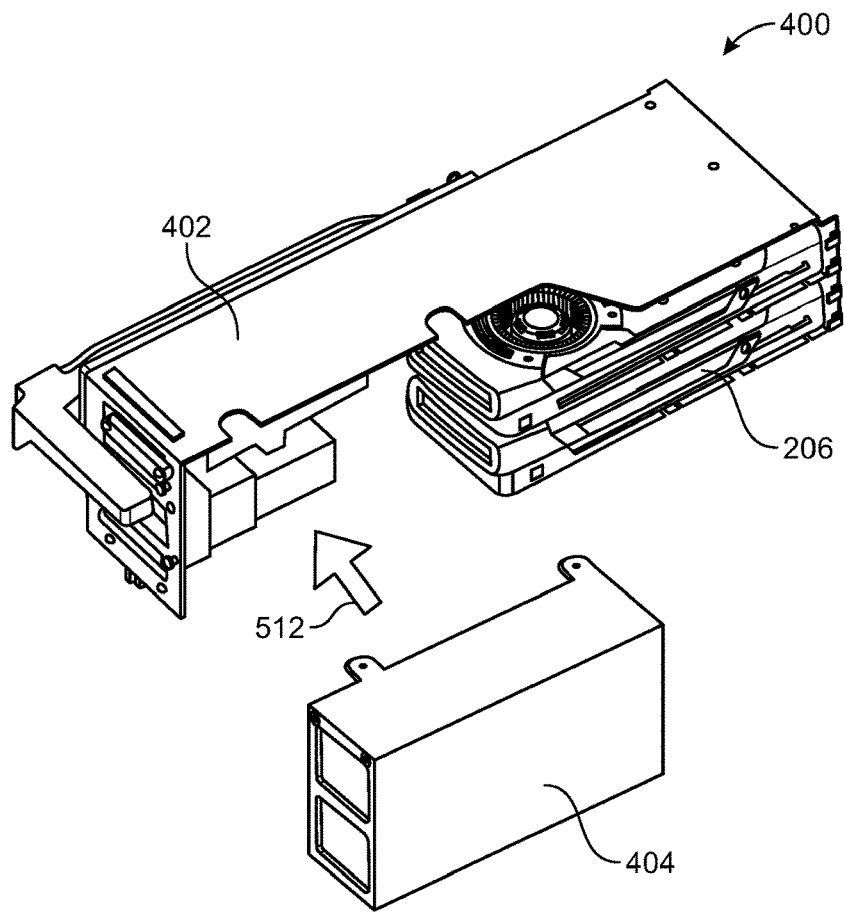

FIG. 5D shows the riser module 400 with the electrical components 206 loaded in position in the riser bracket 402. Movement, in the direction indicated by large arrow 512, provides closing of the air duct 404 relative to the riser bracket 402.

Figure 5E:
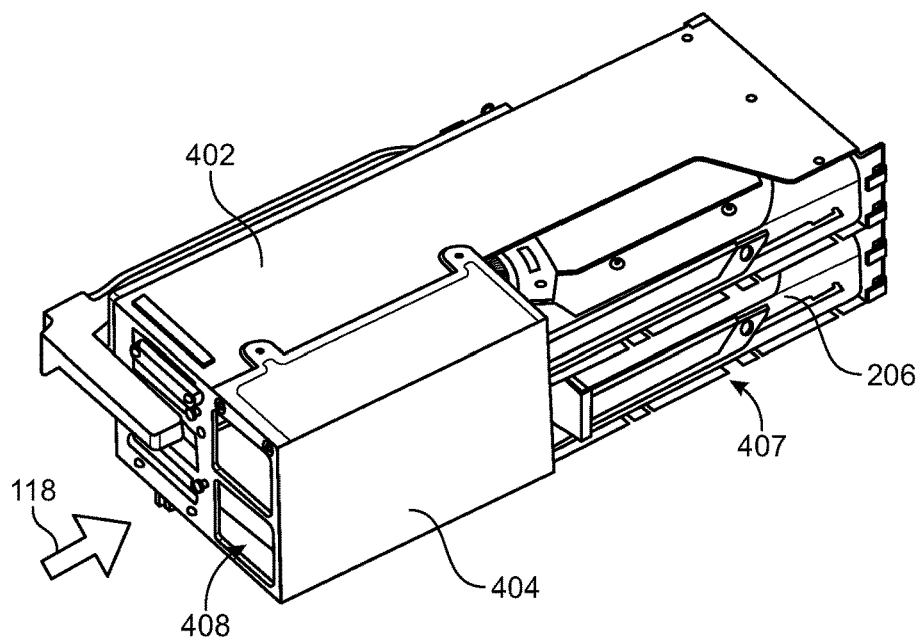

FIG. 5E completes the steps depicted by previous FIGS. 5A-5D. The riser module 400 is shown with the electric components 206 loaded into the riser bracket 402, and the air duct 404 is in the closed position. The air vents 408 provide air flow 118 into the interior space 407 to cool electrical components 206.

Figure 6A:
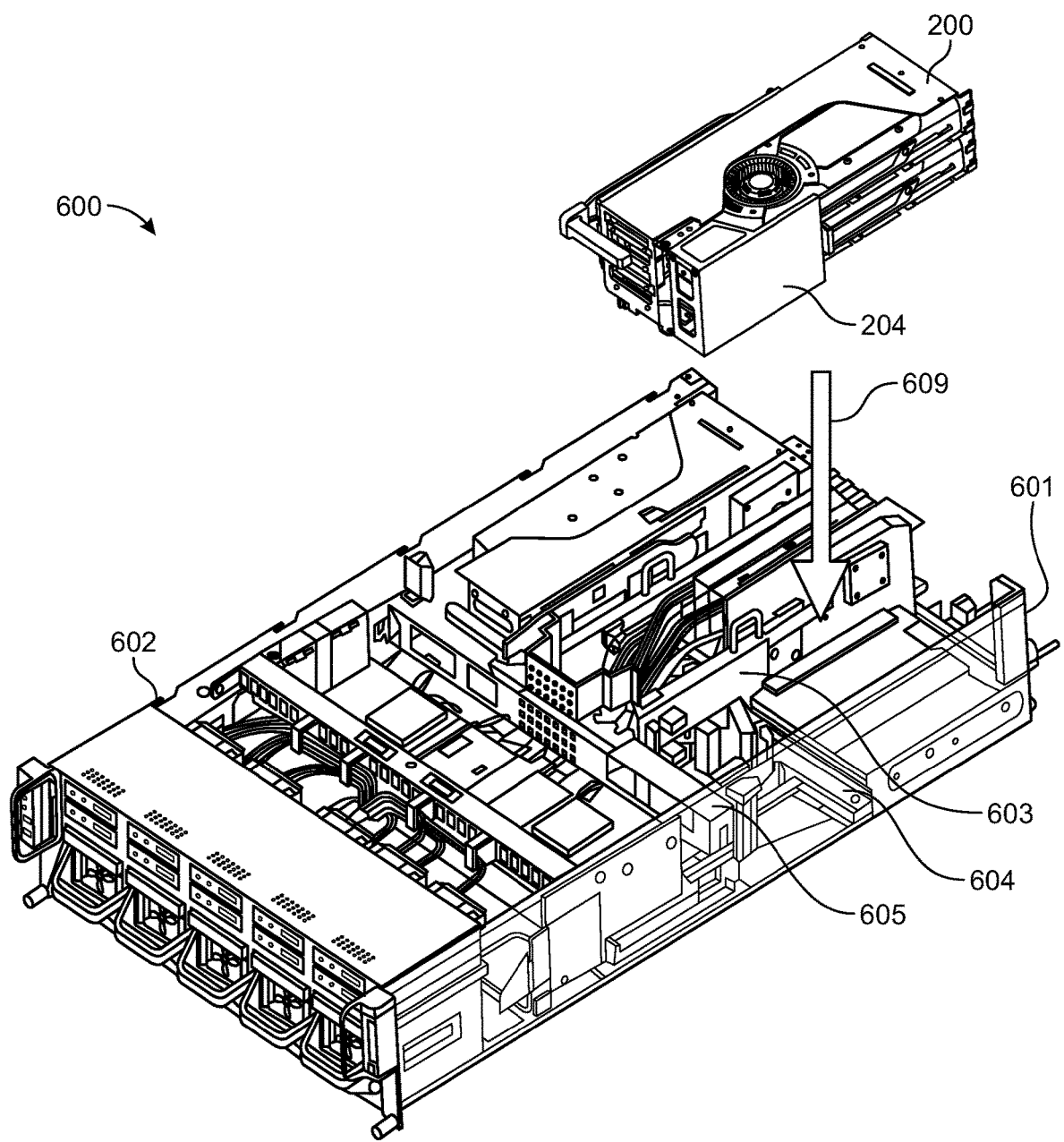
FIG. 6A is a perspective view of a server system including a chassis and the riser module of FIG. 2.

FIG. 6A is a perspective view of a server system 600 that includes a chassis 602 and the riser module 200. The riser module 200 is in an unloaded position relative to the chassis 602. In the unloaded position, electric components can be placed into riser module 200 by moving the air duct 204 to the open position (e.g., see FIG. 3A-3E). The loading of the riser module 200 into a riser dock 604 of the chassis 602 is indicated by the arrow 609. The riser dock 604 can include orienting elements such as corner bracket 601 and interior wall 603. These orienting elements provide alignment of air duct 204, of the riser module 200, with cooling solutions in the chassis 602, such as an air duct 605.

Figure 6B:
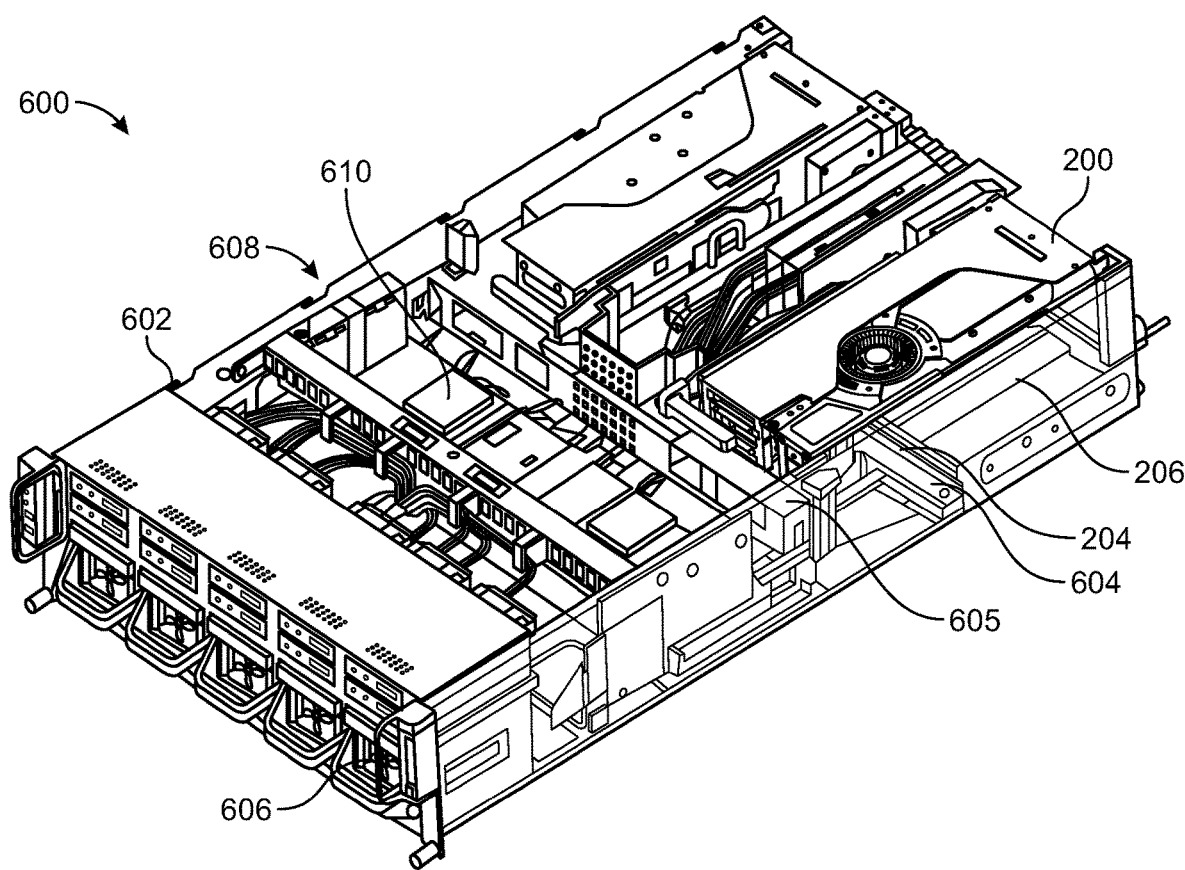
FIG. 6B is a perspective view of the server system with the riser module of FIG. 2 loaded in the chassis.

FIG. 6B is a perspective view of the sever system 600 with the riser module 200 in a loaded position relative to the chassis 602. In the loaded position, the riser module 200 is in the riser dock 604, and the air duct 204 is in the closed position. One or more fans 606 are mounted to the chassis 602. Fans 606 draw ambient air from outside the chassis 602 into a duct system of the chassis 602. The duct system of the chassis 602 includes a duct 608 above CPUs 610. The duct 608 is fluidly connected to the duct 605. The duct 605 is in front of, and fluidly connected to, the riser module air duct 204. Therefore, the duct system provides ambient air, drawn from outside the chassis 602, into the riser module air duct 204 to cool electric components 206.

Figure 6C:
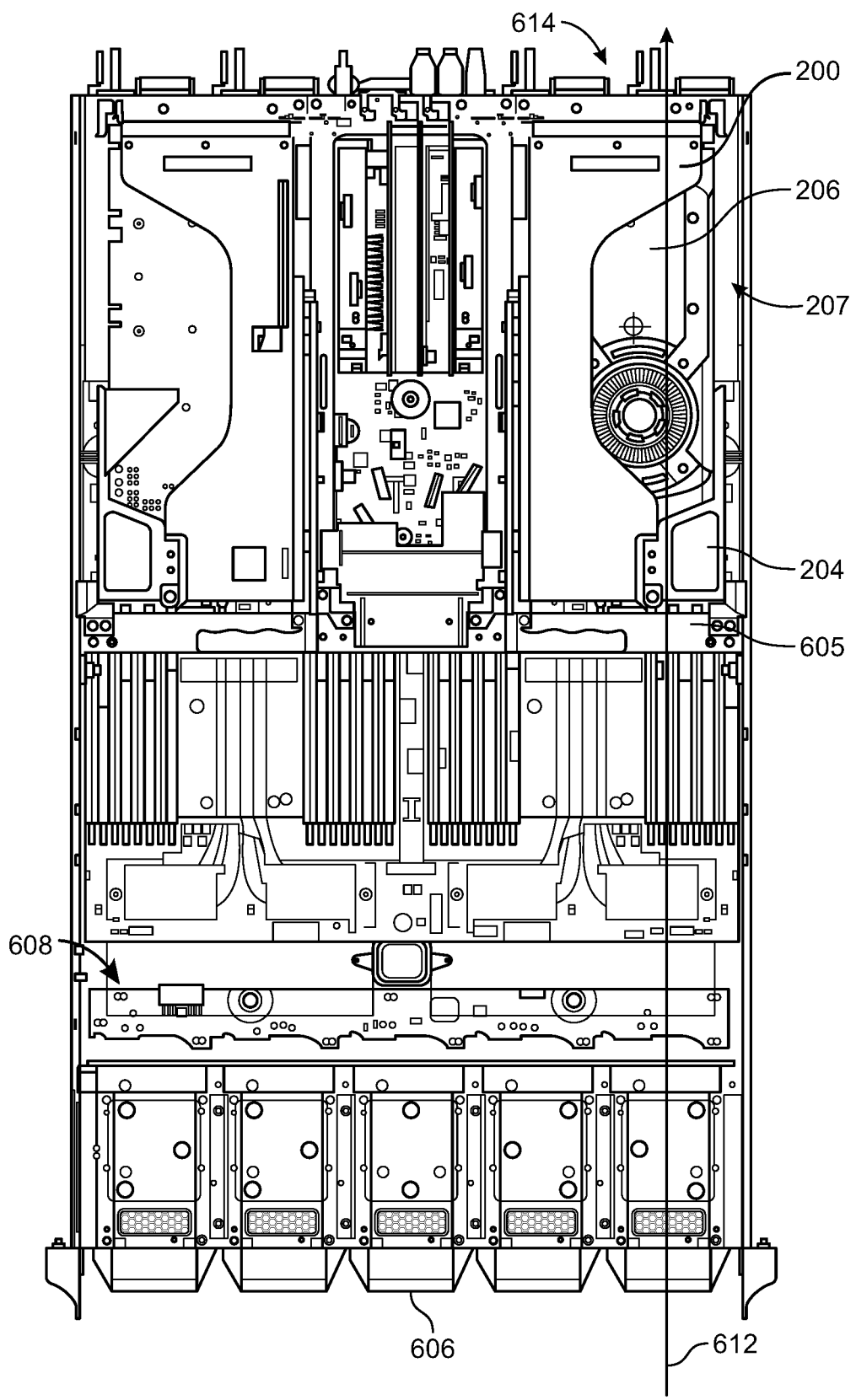
FIG. 6C is a top view of the server system with the riser module of FIG. 2 loaded in the chassis.

FIG. 6C shows a top view of server 600 with the installed riser module 200. The fans 606, air ducts 608, 605, and air duct 204 is also shown. Air follows a path generally indicated by the arrow 612. That is, air is drawn from fans 606, through the ducts, and into the interior space 207 of the riser bracket 202. The air exits the chassis through vents 614 at the back of chassis 602.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A riser module comprising:
   a riser bracket having a side opening to an interior space of the riser bracket, the interior space being configured to receive one or more electrical components; and
   an air duct movably coupled to the riser bracket, the air duct having at least one air vent for cooling the interior space of the riser bracket, the air duct being movable between a plurality of positions relative to the riser bracket, the plurality of positions including at least an open position and a closed position, the at least one air vent being in an approximately parallel orientation relative to the riser bracket in the closed position, and wherein the at least one air vent is in an approximately perpendicular orientation relative to the riser bracket when in the open position.

2. The riser module according to claim 1, wherein in the closed position, the at least one air vent provides an air flow path, the air flow path leading into the interior space of the riser bracket, and in the open position, the side opening provides an electrical component loading path, the electrical component loading path leading into the interior space of the riser bracket.

3. The riser module according to claim 1, wherein the air duct is rotatably movable between the open position and the closed position, and the air duct is rotated away from the riser bracket in the open position.

4. The riser module according to claim 1, wherein the riser bracket includes a front wall and a top wall, the front wall and the top wall defining in part the interior space of the riser bracket, the front wall being proximate the side opening, the at least one air vent providing air flow into the interior space proximate the front wall.

5. The riser module according to claim 4, wherein the air duct is hingedly connected to the riser bracket near the front wall.

6. The riser module according to claim 1, wherein, in the closed position, the air duct is in contact with the riser bracket along a top edge.

7. The riser module according to claim 1, further comprising one or more electrical component docking stations mounted to a wall in the interior space of the riser bracket.

8. The riser module according to claim 7, wherein the electrical component docking station is mounted to a wall opposite the side opening of the riser bracket.

9. The riser module according to claim 1, further comprising one of more slots in a wall of the riser bracket for slide-in placement of the one or more electrical components into the interior space of the riser bracket.

10. A server system comprising:
a chassis including a riser dock;
a fan mounted to the chassis;
a riser module positionable in the riser dock, the riser module including;
   a riser bracket having a side opening to an interior space of the riser bracket, the interior space being configured to receive one or more electrical components; and
   an air duct movably coupled to the riser bracket, the air duct having at least one air vent for cooling the interior space of the riser bracket, the air duct being movable between a plurality of positions relative to the riser bracket, the plurality of positions including at least an open position and a closed position, the at least one air vent being in an approximately parallel orientation relative to the riser bracket in the closed position, and wherein the at least one air vent is in an approximately perpendicular orientation relative to the riser bracket when in the open position.

11. The server system according to claim 10, further comprising:
   a loaded configuration, including the riser module positioned in the riser dock and the air duct in the closed position; and
   an unloaded configuration, including the riser module removed from the riser dock, and an unobstructed access to the side opening of the riser bracket when the movable air duct is in the open position.

12. The server system according to claim 11, wherein, in the loaded configuration, the fan is configured to provide ambient air from outside the chassis to the at least one air vent and into the interior space of the riser bracket.

* * * * *